United States Patent
Xie et al.

(10) Patent No.: US 9,911,619 B1
(45) Date of Patent: Mar. 6, 2018

(54) FIN CUT WITH ALTERNATING TWO COLOR FIN HARDMASK

(71) Applicant: GLOBALFOUNDRIES Inc., Grand Cayman (KY)

(72) Inventors: Ruilong Xie, Schenectady, NY (US); Hoon Kim, Clifton Park, NY (US); Catherine B. Labelle, Schenectady, NY (US); Lars W. Liebmann, Halfmoon, NY (US); Chanro Park, Clifton Park, NY (US); Min Gyu Sung, Latham, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/291,446

(22) Filed: Oct. 12, 2016

(51) Int. Cl.
    *H01L 21/308* (2006.01)
    *H01L 21/3065* (2006.01)
    *H01L 29/78* (2006.01)
    *H01L 29/66* (2006.01)

(52) U.S. Cl.
    CPC ...... *H01L 21/3088* (2013.01); *H01L 21/3065* (2013.01); *H01L 21/3081* (2013.01); *H01L 21/3085* (2013.01); *H01L 21/3086* (2013.01); *H01L 29/66795* (2013.01); *H01L 29/7851* (2013.01)

(58) Field of Classification Search
    CPC ............... H01L 21/308; H01L 21/3088; H01L 21/3086; H01L 29/66795; H01L 21/3081; H01L 29/6656; H01L 29/78651; H01L 29/78654; H01L 29/7851; H01L 21/3085
    See application file for complete search history.

(56) References Cited

U.S. PATENT DOCUMENTS

| | | | |
|---|---|---|---|
| 8,492,228 B1 | 7/2013 | Leobandung et al. | |
| 2006/0263699 A1* | 11/2006 | Abatchev | H01L 21/0337 430/5 |
| 2007/0026684 A1* | 2/2007 | Parascandola | H01L 21/0337 438/733 |
| 2007/0249170 A1* | 10/2007 | Kewley | H01L 21/0337 438/706 |
| 2013/0175618 A1 | 7/2013 | Cheng et al. | |
| 2015/0014772 A1 | 1/2015 | Cheng et al. | |
| 2017/0092506 A1* | 3/2017 | deVilliers | H01L 21/0337 |

* cited by examiner

*Primary Examiner* — Caridad Everhart
(74) *Attorney, Agent, or Firm* — Thompson Hine LLP; Francois Pagette (57) ABSTRACT

Methods for a lithographic process used to pattern fins for fin-type field-effect transistors (FinFETs). A first plurality of hardmask sections may be formed, and sacrificial spacers may be formed on vertical sidewalls of the first plurality of hardmask sections. Each of the first plurality of hardmask sections is comprised of a first material. Gaps between the sacrificial spacers are filled with a second material, which is selected to etch selectively to the first material, in order to define a second plurality of hardmask sections each comprised of the second material.

19 Claims, 8 Drawing Sheets

FIN CUT WITH ALTERNATING TWO COLOR FIN HARDMASK

BACKGROUND

The present invention relates to semiconductor device fabrication and integrated circuits and, more specifically, to methods for a lithographic process used to pattern fins for fin-type field-effect transistors (FinFETs).

A FinFET is a non-planar device structure for a field-effect transistor that is capable of being more densely packed in an integrated circuit than planar field-effect transistors. A FinFET includes one or more fins of semiconductor material and an overlapping gate electrode that intersects a channel within the body of each fin. The channel in each fin is located between heavily-doped source/drain regions formed in fin sections that are not covered by the gate electrode. The fin dimensions and the number of fins determine the effective channel width of the FinFET.

Lithographic processes may be used to form the fins for a FinFET. For example, using optical photolithography, features can be formed by patterning a photoresist layer and an image of the features can be transferred into an underlying semiconductor layer to form fins. However, lithographic processes are incapable of satisfying the ever-increasing demand for smaller and more closely spaced fins.

Sidewall image transfer (SIT) involves the use of mandrels as sacrificial structures. Sidewall spacers, which have a thickness less than that permitted by the current ground rules for optical lithography, are formed on the vertical sidewalls of the mandrels. After selective removal of the mandrels, the sidewall spacers are used as an etch mask to etch an underlying hardmask and semiconductor layer, for example, with a directional reactive ion etching (RIE). Because the sidewall spacers may have a sublithographic line width, the fins formed from the underlying semiconductor layer will also have a sublithographic line width. The sidewall spacers are removed after the fins are formed.

A problem associated with forming semiconductor fins at tight pitch relates to the cutting of unwanted fins. As the available space between fins decreases, it becomes increasingly difficult to remove unwanted fins with etching and the assistance of a cut mask without adversely affecting adjacent fins due to process variation and small process margin of lithographic processes. Misalignment of the cut mask may lead to undesired partial or complete cutting of adjacent fins.

Improved methods for a lithographic process used to pattern fins for FinFETs are needed.

SUMMARY

In an embodiment of the invention, a method includes forming a first plurality of hardmask sections each comprised of a first material, forming sacrificial spacers on vertical sidewalls of the first plurality of hardmask sections, and filling gaps between the sacrificial spacers with a second material selected to etch selectively to the first material in order to define a second plurality of hardmask sections each comprised of the second material.

In an embodiment of the invention, a method includes forming a hardmask layer on a substrate, forming a first plurality of hardmask sections on the hardmask layer, forming sacrificial spacers on vertical sidewalls of the first plurality of hardmask sections, etching the hardmask layer selective to the sacrificial spacers and the first plurality of hardmask sections to form trenches in the hardmask layer, and filling the trenches with a second plurality of hardmask sections.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
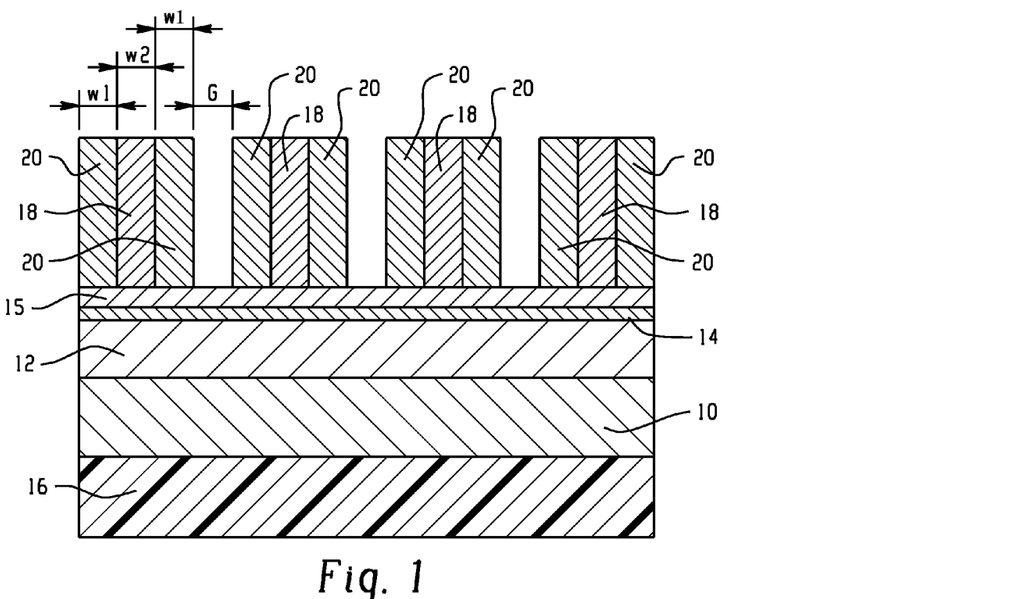
FIGS. 1-6 are cross-sectional views of a portion of a substrate at successive stages of a processing method in accordance with embodiments of the invention.

With reference to FIG. 1 and in accordance with an embodiment of the invention, a hardmask layer 10 and a series of layers 12, 14, 15 are sequentially formed as a layer stack on the top surface of a substrate 16 comprised of a semiconductor material. The substrate 16 may be a bulk substrate or a device layer of a semiconductor-on-insulator (SOI) substrate. The materials forming the layers 10, 12, 14, 15 may be selected to be readily removed by, for example, etching at a subsequent fabrication stage. Layer 10 and layer 14 may be composed of silicon nitride ($Si_3N_4$) deposited by, for example, chemical vapor deposition (CVD). Layer 12 may be composed of, for example, carbon such as amorphous carbon deposited by CVD. Layer 15 may be composed of, for example, silicon dioxide ($SiO_2$) deposited by CVD. The material constituting the hardmask layer 10 may be selected to be selectively removed relative to the constituent material of the substrate 16 such that a pattern formed in the hardmask layer 10 can be transferred to the substrate 16. As used herein, the term "selective" in reference to a material removal process (e.g., etching) denotes that, with an appropriate etchant choice, the material removal rate (e.g., etch rate) for the targeted material is higher than the removal rate for at least another material exposed to the material removal process.

Hardmask sections 18 are formed as mandrels on a top surface of layer 15. The hardmask sections 18 may be formed by depositing a blanket layer of a material on the entire top surface of layer 15 and patterning the layer by lithography and etching. The patterning can be performed, for example, by applying a photoresist layer (not shown) on the material layer, lithographically patterning the photoresist layer to define a set of areas on layer 18 covered by the patterned photoresist layer, and transferring the pattern from the photoresist layer to the material layer by an anisotropic etch. The anisotropic etch can remove the material constituting the hardmask sections 18 selective to the material constituting layer 15. Each hardmask section 18 may have a rectangular shape in cross-section from a perspective normal to the top surface, and the hardmask sections 18 may have a uniform width and pitch. The hardmask sections 18 may be composed of silicon, such as amorphous silicon deposited by CVD.

The hardmask sections 18 can also be formed using sidewall image transfer (SIT). To that end, mandrels can be formed on a top surface of the blanket layer of the hardmask material and sidewall spacers may be formed at each side of the mandrels. After the mandrels are removed selective to the sidewall spacers, the pattern of features defined by the spacers may be transferred to the blanket layer of the hardmask material by an anisotropic etching process to form the hardmask sections 18.

Sacrificial spacers 20 are formed on the top surface of layer 15 as sidewall spacers at locations adjacent to the vertical sidewalls of the hardmask sections 18. The sacrificial spacers 20 may be formed by depositing a conformal layer comprised of a dielectric material on the hardmask sections 18 and layer 15, and shaping the conformal layer with an anisotropic etching process, such as reactive ion etching (RIE), that preferentially removes the dielectric material from horizontal surfaces, such as the top surfaces of the layer 15 and hardmask sections 18. The hardmask sections 18 have a width, w2, and the sacrificial spacers 20 have a width, w1, that is related to the thickness of the deposited conformal layer and that may be equal to the thickness of the deposited conformal layer. The dimensions and pitch of the hardmask sections 18, as well as the thickness of the deposited conformal layer, establish the pitch of the sacrificial spacers 20. In an embodiment, these parameters may be selected such that the pitch of the sacrificial spacers 20 is constant or uniform. Adjacent sacrificial spacers 20 on nearest-neighbor hardmask sections 18 are separated by a gap having a width, G.

The material constituting the sacrificial spacers 20 may be chosen to be selectively removed relative to the hardmask sections 18. In an embodiment in which the hardmask sections 18 are composed of amorphous silicon, the sacrificial spacers 20 may be composed of silicon nitride ($Si_3N_4$) deposited by CVD. The sacrificial spacers 20 may be formed by a low-temperature deposition process. For example, the low temperature process may be plasma enhanced chemical vapor deposition (PECVD) in which silicon nitride is formed with a plasma generated from reaction gases, such as silane ($SiH_4$) and ammonia ($NH_3$), at a substrate temperature in a range of 200° C. to 400° C.

Figure 2:
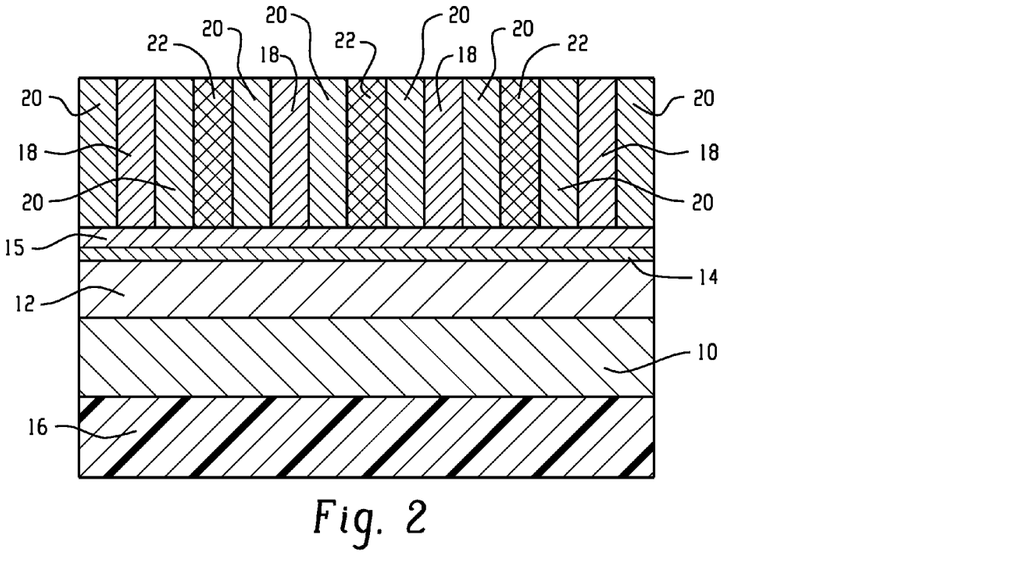

With reference to FIG. 2 in which like reference numerals refer to like features in FIG. 1 and at a subsequent fabrication stage, hardmask sections 22 are formed by depositing a gap-fill layer that fills the gaps G (FIG. 1) and planarizing the gap-fill layer with, for example, chemical mechanical polishing (CMP). The hardmask sections 22 may be composed of a material, such as silicon dioxide ($SiO_2$) deposited by CVD, and may be composed of the same material as layer 15. The material constituting the hardmask sections 22 may be chosen to be selectively removed relative to the respective materials constituting the hardmask sections 18 and the sacrificial spacers 20.

Figure 3:
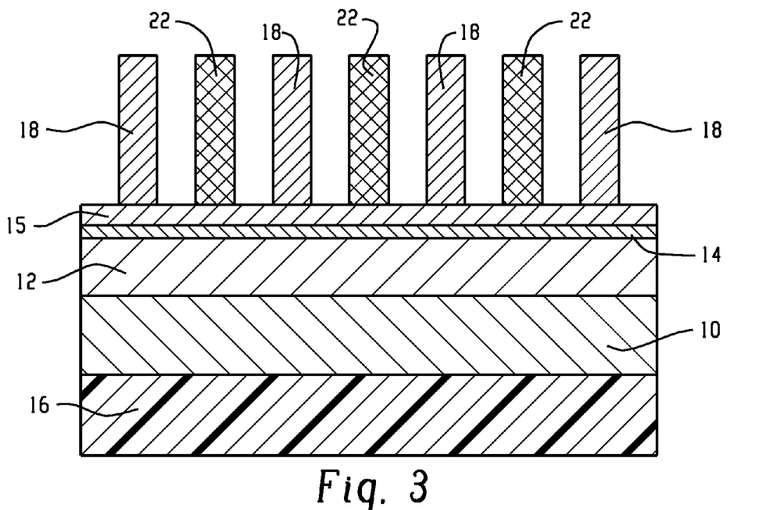

With reference to FIG. 3 in which like reference numerals refer to like features in FIG. 2 and at a subsequent fabrication stage, the sacrificial spacers 20 are removed selective to the hardmask sections 18 and selective to the hardmask sections 22 with an etching process having a suitable etch chemistry. The hardmask sections 18 provide a hardmask constituted by a material and the hardmask sections 22 provide another hardmask constituted by a different material that can be selectively removed relative to the material constituting the hardmask sections 18. These different sections constitute an alternative two color fin hardmask that promotes the ability for form fin cuts.

The hardmask sections 18 and hardmask sections 22 have a lengthwise parallel arrangement in which the hardmask sections 18 and hardmask sections 22 sequentially alternate in respective spatial patterns on the top surface of the substrate 16. In particular, the hardmask sections 18 and hardmask sections 22 are interleaved in that the hardmask sections 18, which are arranged in one sequence, alternate with hardmask sections 22, which are arranged in another sequence, in a cyclic fashion such that each sequence retains its identity. The hardmask sections 18, 22 are asynchronously formed at different times in the process flow with the hardmask sections 22 being formed after the hardmask sections 18 and based at least in part on the prior formation of the hardmask sections 18. The hardmask sections 18 and hardmask sections 22 form elements of a hardmask that can be used to form fins from the semiconductor material of the substrate 16. The hardmask sections 22 are offset from the hardmask sections 18, and the offset distance may be selected to provide a uniform pitch, in combination with a uniform width, for the composite set of hardmask sections 18, 22.

Figure 4:
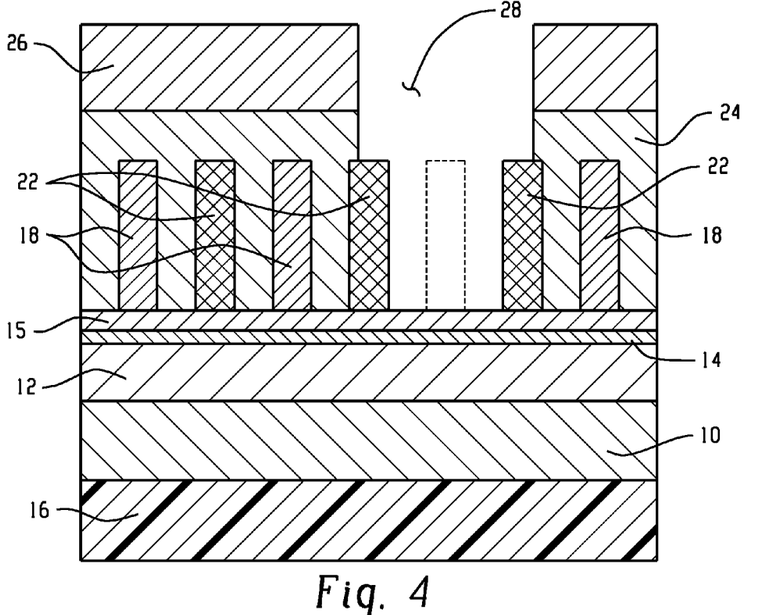

With reference to FIG. 4 in which like reference numerals refer to like features in FIG. 3 and at a subsequent fabrication stage, a cut or etch mask 24 may be applied and patterned, after the sacrificial spacers 20 are selectively removed, using a patterned photoresist layer 26 to form a window or opening 28 in the etch mask 24 that exposes one of the hardmask sections 18 (in dashed lines) for removal with an etching process, such as a reactive ion etching (RIE) process. The opening 28 may be formed relative to the location of, for example, the hardmask section 18 to be removed with an improved misalignment process window. For example, the opening 28 may be twice as large as conventional because of the etch selectivity between the hardmask sections 22 and the hardmask sections 18. The material constituting the etch mask 24 may be comprised of a layer of an organic material, such as an organic planarization layer (OPL).

The opening 28 may also partially or completely expose one or more of the hardmask sections 22 that are adjacent to the hardmask section 18 exposed by the opening 28. Hardmask sections 18 and hardmask sections 22 that are outside of the opening 28 are protectively covered by the etch mask 24 during the etching process. The hardmask section 18 exposed by the opening 28 may be removed without significant etch erosion of any hardmask section 22 that is partially or completely exposed by the opening 28. The resulting single fin cut through removal of the hardmask section 18 occurs before the masked etch of the substrate 16 to form fins from the semiconductor material of the substrate 16.

Figure 5:
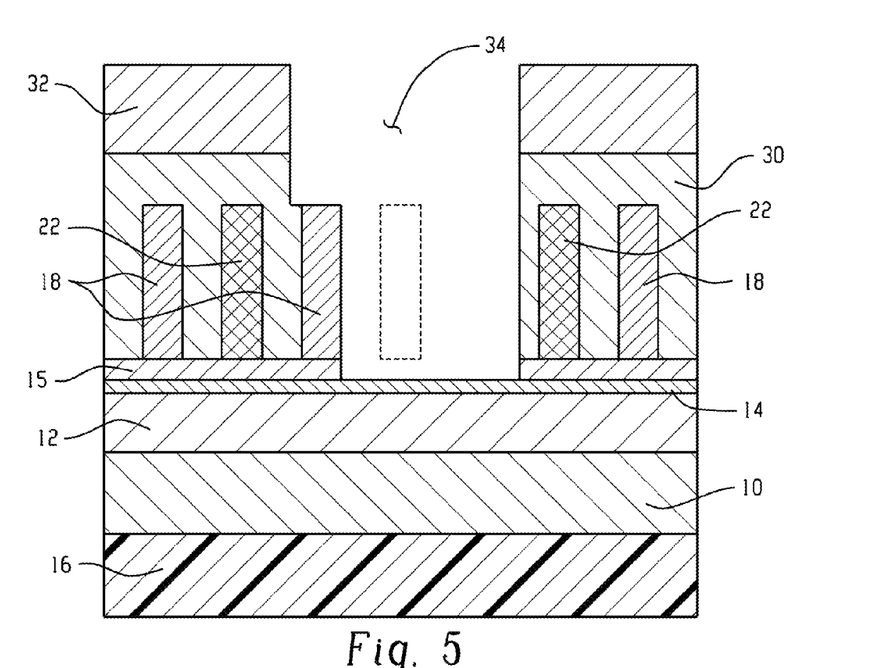

With reference to FIG. 5 in which like reference numerals refer to like features in FIG. 4 and at a subsequent fabrication stage, the etch mask 24 may be removed after the hardmask section 18 exposed within the opening 28 is removed. A cut or etch mask 30 may be applied and patterned using a patterned photoresist layer 32 to form a window or opening 34 in the etch mask 30 that exposes one of the hardmask sections 22 (in dashed lines) for removal with an etching process, such as a reactive ion etching (RIE) process. The opening 34 may be formed relative to the location of, for example, the hardmask section 22 to be removed with an improved misalignment process window. For example, the opening 34 may be twice as large as conventional because of the etch selectivity between the hardmask sections 18 and the hardmask sections 22, and the effective fin pitch increase for purposes of fin cuts. The material constituting the etch mask 30 may be comprised of a layer of an organic material, such as an organic planarization layer (OPL).

The opening 34 may also partially or completely expose one or more of the hardmask sections 18 that are adjacent to the hardmask section 22 exposed by the opening 34. Hardmask sections 18 and hardmask sections 22 that are outside of the opening 34 are protectively covered by the etch mask 30 during the etching process. The hardmask section 22 exposed by the opening 34 may be removed without significant etch erosion of any hardmask section 18 that is partially or completely exposed by the opening 34. The resulting fin cut through removal of the hardmask section 22 occurs before the masked etch of the substrate 16 to form fins from the semiconductor material of the substrate 16. A portion of the layer 15 may be removed within the inner boundary of the opening 34 if constituted by the same material as the hardmask sections 22.

In an alternative embodiment, the fin cut using the etch mask 24 or the fin cut using the etch mask 30 may be omitted from the process flow.

Figure 6:
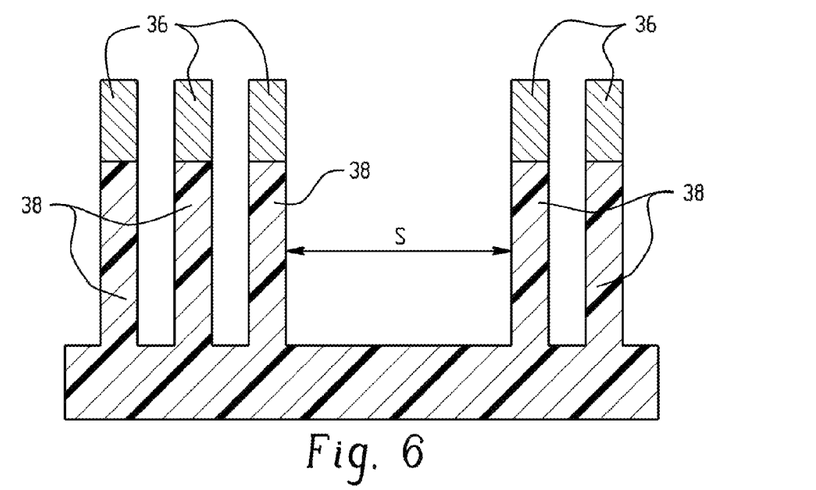

With reference to FIG. 6 in which like reference numerals refer to like features in FIG. 5 and at a subsequent fabrication stage, the hardmask sections 18 and hardmask sections 22 are used to pattern the hardmask layer 10 and form hardmask sections 36 at their respective locations. After the hardmask sections 18 and hardmask sections 22 are removed, the hardmask sections 36 may be used as an etch mask during a subsequent etching process that etches the substrate 16 to form fins 38. Fins 38 are not formed at the locations of the removed hardmask section 18 and the removed hardmask section 22, which results in a gap or space S between one group of fins 38 and an adjacent group of fins 38.

The fins 38 may be used to form one or more fin-type field-effect transistors (FinFETs) that further include a functional gate structure, spacers, source and drain regions, etc. The functional gate structure may be formed utilizing either a gate-first or a gate-last process.

Figure 7:
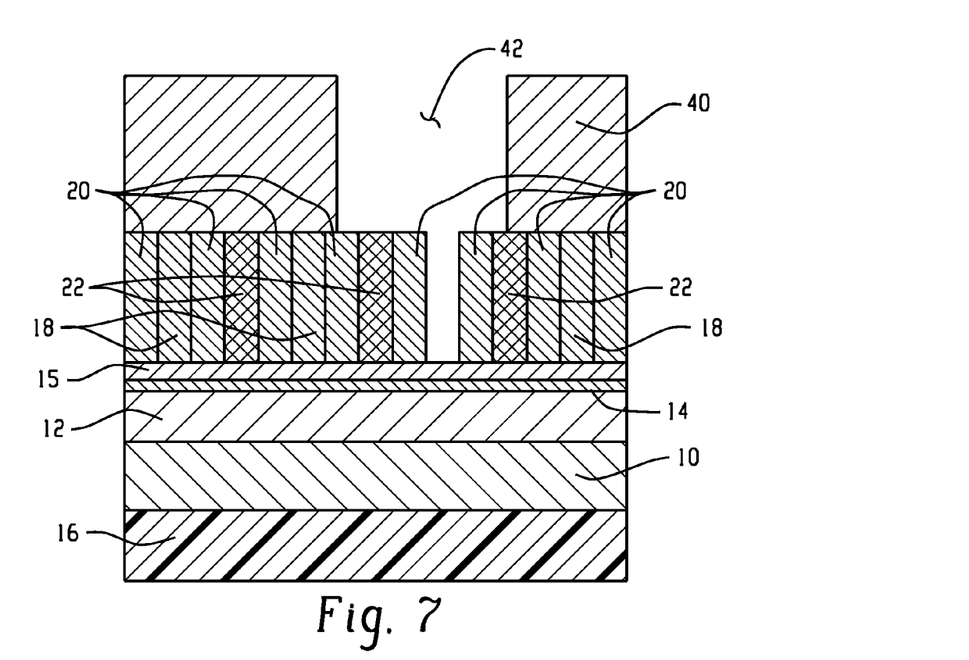
FIGS. 7-9 are cross-sectional views of a substrate portion at successive stages of a processing method in accordance with embodiments of the invention.

With reference to FIG. 7 in which like reference numerals refer to like features in FIG. 2 and in accordance with an alternative embodiment, a cut or etch mask 40 may be applied and patterned using a patterned photoresist layer (not shown) to form a window or opening 42 in the etch mask 40 that exposes one of the hardmask sections 18 for removal with an etching process. The opening 42 may be formed relative to the location of, for example, the hardmask section 18 to be removed with an improved misalignment process window. For example, the opening 42 may be twice as large as conventional because of the etch selectivity between the hardmask sections 18, the sacrificial spacers 20, and the hardmask sections 22. The material constituting the etch mask 40 may be comprised of a layer of an organic material, such as an organic planarization layer (OPL).

The opening 42 may also partially or completely expose one or more of the sacrificial spacers 20 and one or more of the hardmask sections 22 that are adjacent to the hardmask section 18 exposed by the opening 42. Hardmask sections 18, sacrificial spacers 20, and hardmask sections 22 that are outside of the opening 42 are protectively covered by the etch mask 40 during the etching process. The hardmask section 18 exposed by the opening 42 may be removed without significant etch erosion of any sacrificial spacer 20 or hardmask section 22 that is partially or completely exposed by the opening 42. The resulting fin cut through removal of the hardmask section 18 exposed within the opening 42 occurs before the masked etch of the substrate 16 to form fins 38.

Figure 8:
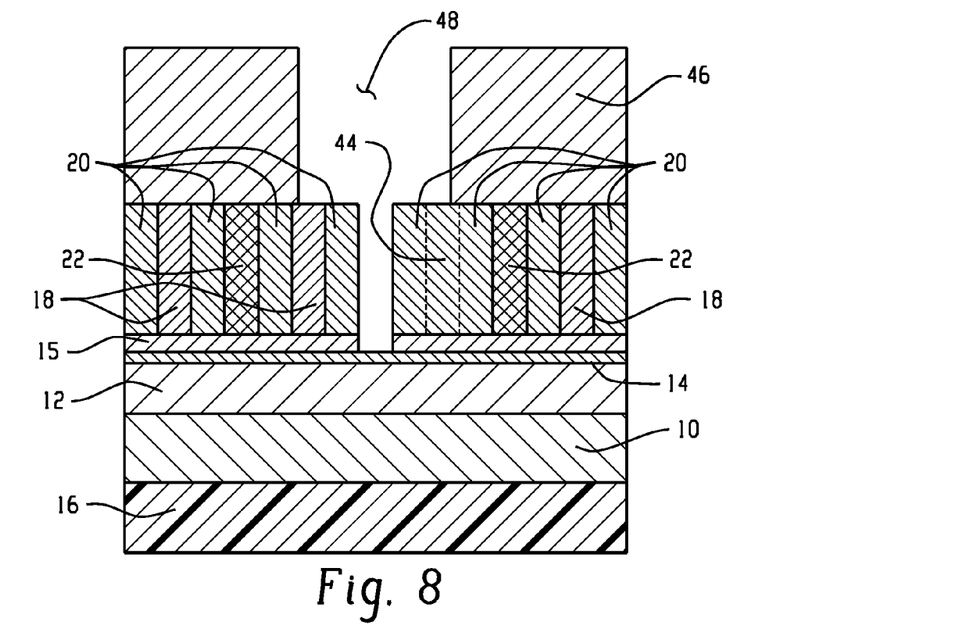

With reference to FIG. 8 in which like reference numerals refer to like features in FIG. 7 and at a subsequent fabrication stage, the etch mask 40 may be removed after the hardmask section 18 exposed within the opening 42 is removed, and a gap-fill layer 44 is applied and planarized with, for example, chemical mechanical polishing (CMP) in order to fill the open space vacated by the removed hardmask section 18. The gap-fill layer 44 may be composed of a material, such as silicon nitride ($Si_3N_4$) deposited by CVD, and may be composed of the same material as the sacrificial spacers 20. The material constituting the gap-fill layer 44 is chosen to etch selectively to the material that constitutes the hardmask sections 18 and the material that constitutes the hardmask sections 22.

A cut or etch mask 46 may be applied and patterned using a patterned photoresist layer to form a window or opening 48 in the etch mask 46 that exposes one of the hardmask sections 22 for removal with an etching process. The opening 48 may be formed relative to the location of, for example, the hardmask section 22 to be removed with an improved misalignment process window as compared with a conventional situation in which the hardmask sections are composed of the same material. For example, the opening 48 may be twice as large as conventional because of the etch selectivity between the hardmask sections 18, the sacrificial spacers 20, and the hardmask sections 22. The material constituting the etch mask 46 may be comprised of a layer of an organic material, such as an organic planarization layer (OPL).

The opening 48 may also partially or completely expose one or more of the hardmask sections 18 and one or more of the hardmask sections 22 that are adjacent to the hardmask section 18 that is removed. The hardmask section 22 exposed by the opening 48 may be removed without significant etch erosion of any hardmask section 18 or sacrificial spacer 20 that is partially or completely exposed by the opening 48. Hardmask sections 18, sacrificial spacers 20, and hardmask sections 22 that are outside of the opening 48 are protectively covered by the etch mask 46 during the etching process. The resulting fin cut through removal of the hardmask section 22 occurs before the masked etch of the substrate 16 to form fins from the semiconductor material of the substrate 16. A portion of the layer 15 may be removed within the inner boundary of the opening 48 if constituted by the same material as the hardmask sections 22.

Figure 9:
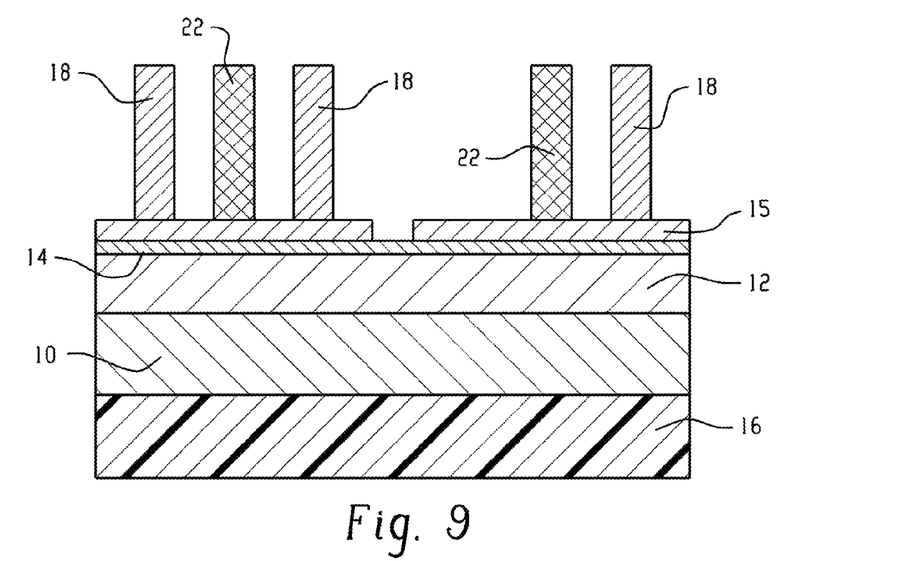

With reference to FIG. 9 in which like reference numerals refer to like features in FIG. 8 and at a subsequent fabrication stage, the etch mask 46 may be removed after the hardmask section 22 exposed within the opening 48 is removed. The sacrificial spacers 20 and the gap-fill layer 44 may be removed selective to the hardmask sections 18 and the hardmask sections 22 using an etching process, such as a reactive ion etching (RIE) process. In this embodiment, the sacrificial spacers 20 are removed after the application of the cut masks.

Processing may continue as shown in FIG. 6 to form the fins 38 using the hardmask sections 18 and hardmask sections 22 to pattern the hardmask 10.

Figure 10:
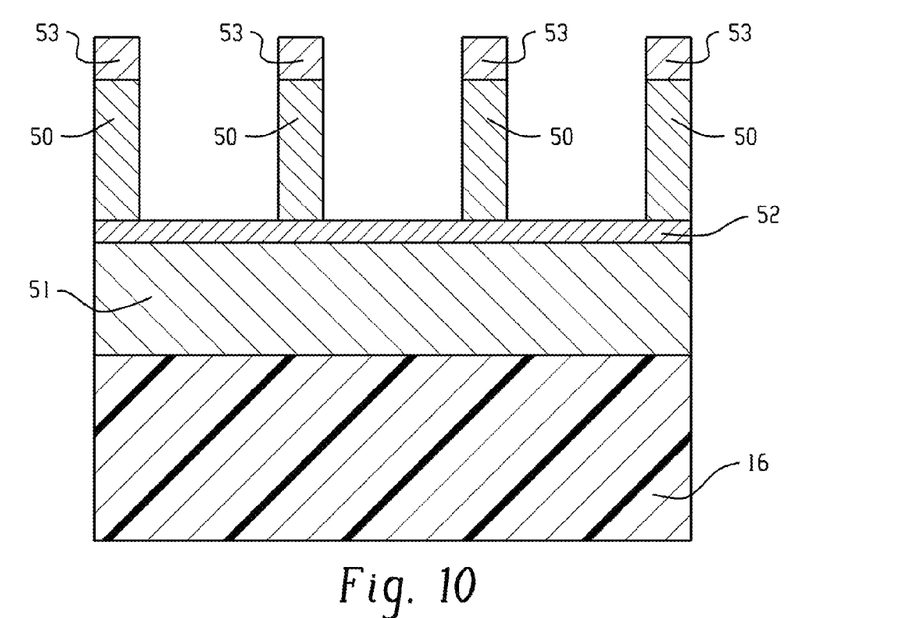
FIGS. 10-13 are cross-sectional views of a substrate portion at successive stages of a processing method in accordance with embodiments of the invention.

With reference to FIG. 10 and in accordance with an alternative embodiment, hardmask sections 50 may be formed from a hardmask layer on a top surface of the substrate 16 with pad layers 51, 52 intervening vertically between the hardmask sections 50 and the substrate 16. Spacers 53 may be formed with a sidewall image transfer (SIT) technique or by lithography technology using an extreme ultraviolet (EUV) wavelength. The spacers 53 used to pattern the hardmask layer with an etching process, such as reactive ion etching (RIE), in order to form the hardmask sections 50 with the same patterned arrangement as the spacers 53. In an embodiment, the hardmask sections 50 may be composed of a material, such as hydrogen-enriched silicon oxycarbide (SiCO:H) deposited by, for example, atomic layer deposition (ALD), and the spacers 53 may be composed of a material, such as silicon dioxide ($SiO_2$) deposited by CVD. The materials forming the pad layers 51, 52 may be selected to be readily removed by, for example, etching at a subsequent fabrication stage. The pad layer 51 may be composed of, for example, silicon nitride ($Si_3N_4$) deposited by CVD. The pad layer 52 may be composed of, for example, silicon dioxide ($SiO_2$) deposited by CVD.

Figure 11:
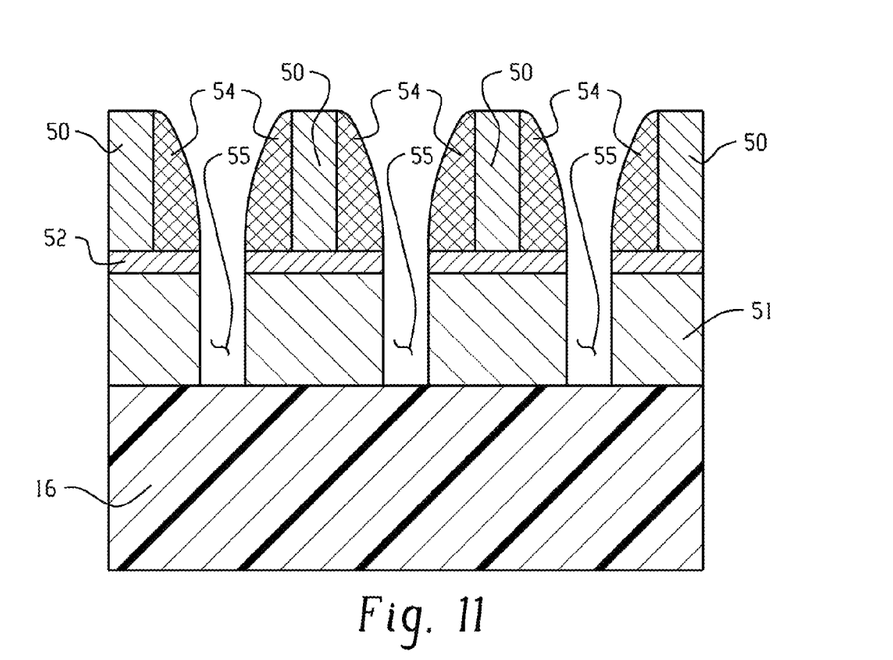

With reference to FIG. 11 in which like reference numerals refer to like features in FIG. 10 and at a subsequent fabrication stage, spacers 54 are formed on the vertical sidewalls of the hardmask sections 50 and spacers 53. The spacers 54 may be formed by depositing a conformal layer comprised of a dielectric material and shaping the conformal layer with an anisotropic etching process, such as reactive ion etching, that preferentially removes the dielectric material from horizontal surfaces. The material constituting the spacers 54 is chosen to be selectively removed relative to the constituent material of the hardmask sections 50 through the choice of a suitable etch chemistry. In an embodiment, the spacers 54 may be composed of silicon dioxide ($SiO_2$) deposited by CVD. Sections of the pad layer 52 between the spacers 54, as well as the spacers 53, may be removed by the etching process used to form the spacers 54.

A selective etching process, such as reactive ion etching, is used to remove unmasked sections of the pad layer 51 to form trenches 55 at locations between adjacent pairs of the spacers 54. The etching process may be performed selective to the materials constituting the hardmask sections 50 and the spacers 54, and selective to the material of the substrate 16 such that the etching process stops at the top surface of the substrate 16.

Figure 12:
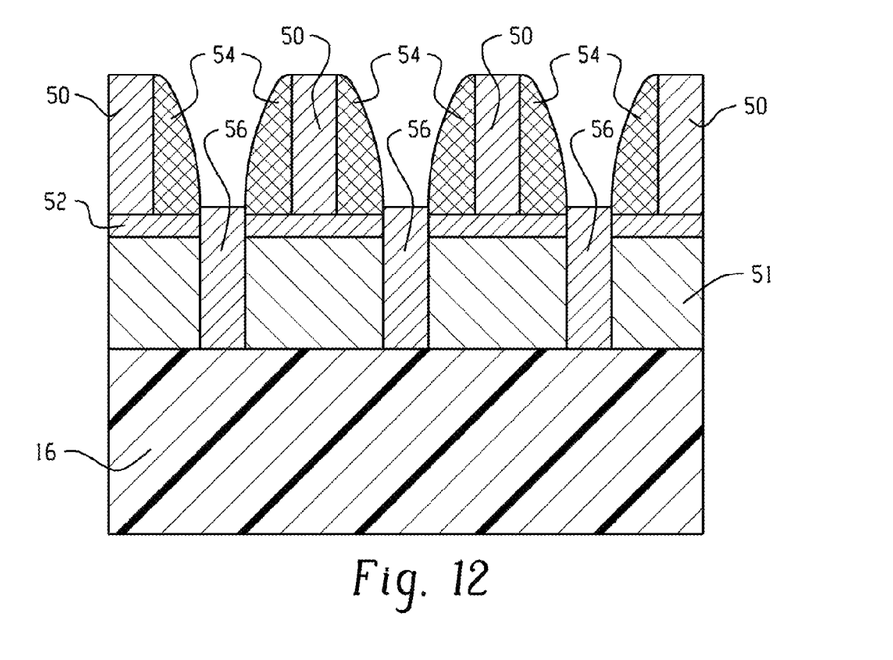

With reference to FIG. 12 in which like reference numerals refer to like features in FIG. 11 and at a subsequent fabrication stage, the trenches 55 may be filled by depositing and etching back a layer of material to form hardmask sections 56. The hardmask sections 56 may be composed of hydrogen-enriched silicon oxycarbide (SiCO:H) deposited by, for example, ALD. The material constituting the hardmask sections 56 may be selected to be selectively removed relative to the constituent materials of the spacers 54 and the pad layer 51.

Figure 13:
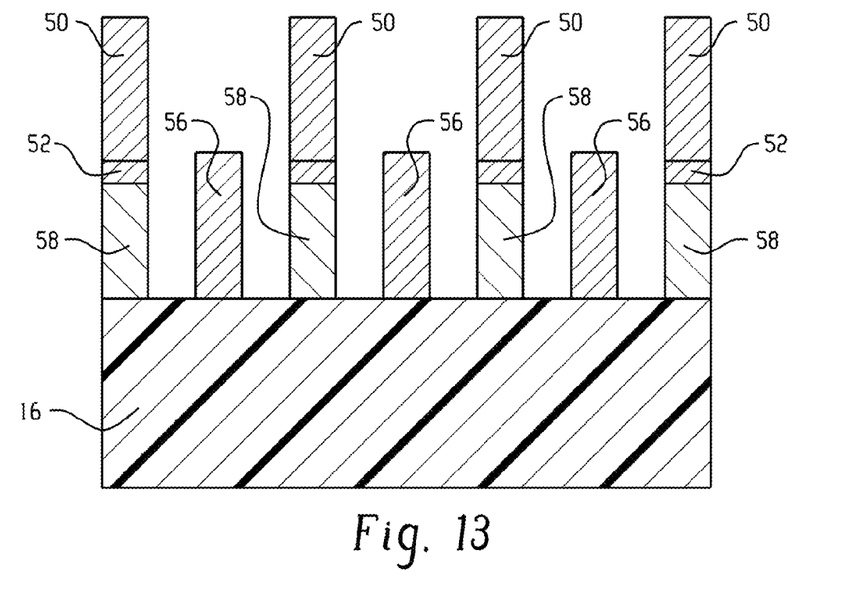

With reference to FIG. 13 in which like reference numerals refer to like features in FIG. 12 and at a subsequent fabrication stage, hardmask sections 58 are formed by etching processes that remove the materials of the spacers 54 and the pad layer 51 selective to the material(s) of the hardmask sections 50 and the hardmask sections 58.

Prior to the performance of the etching processes, an optional gap-fill layer (not shown) may be deposited and planarized to fill the open spaces between the spacers 54. The gap-fill layer may be composed of the same material as the spacers 54.

Processing may continue as shown in FIGS. 4-6 to form the fins 38 using the hardmask sections 56 and hardmask sections 50, 58 to pattern the substrate 16.

Figure 14:
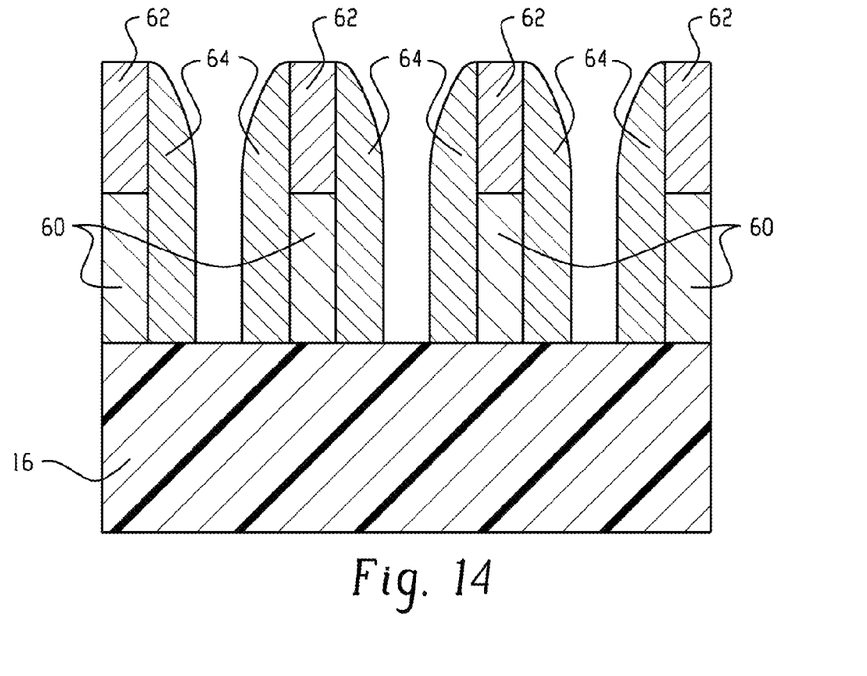
FIGS. 14-16 are cross-sectional views of a substrate portion at successive stages of a processing method in accordance with embodiments of the invention.

With reference to FIG. 14 and in accordance with an alternative embodiment, hardmask sections 60 may be formed on a top surface of the substrate 16. Spacers 62 are formed with a sidewall image transfer (SIT) technique or by lithography technology using an extreme ultraviolet (EUV) wavelength. The spacers 62 used to pattern a hardmask layer with an etching process, such as reactive ion etching (RIE), in order to form the hardmask sections 60 with the same patterned arrangement as the spacers 62. In an embodiment, the hardmask sections 60 may be composed of a material, such as silicon nitride ($Si_3N_4$) deposited by CVD, and the spacers 62 may be composed of a material, such as silicon dioxide ($SiO_2$) deposited by CVD. The layers used to form the hardmask sections 60 and the spacers 62 may be similar to the layers 51, 52 (FIG. 10).

Sacrificial spacers 64 are formed on the vertical sidewalls of the hardmask sections 60 and spacers 62. The sacrificial spacers 64 may be formed by depositing a conformal layer comprised of a dielectric material and shaping the conformal layer with an anisotropic etching process, such as reactive ion etching, that preferentially removes the dielectric material from horizontal surfaces. The material constituting the sacrificial spacers 64 is chosen to be selectively removed relative to the constituent material of the hardmask sections 60 through the choice of a suitable etch chemistry. In an embodiment, the sacrificial spacers 64 may be composed of silicon dioxide ($SiO_2$) deposited by CVD.

Figure 15:
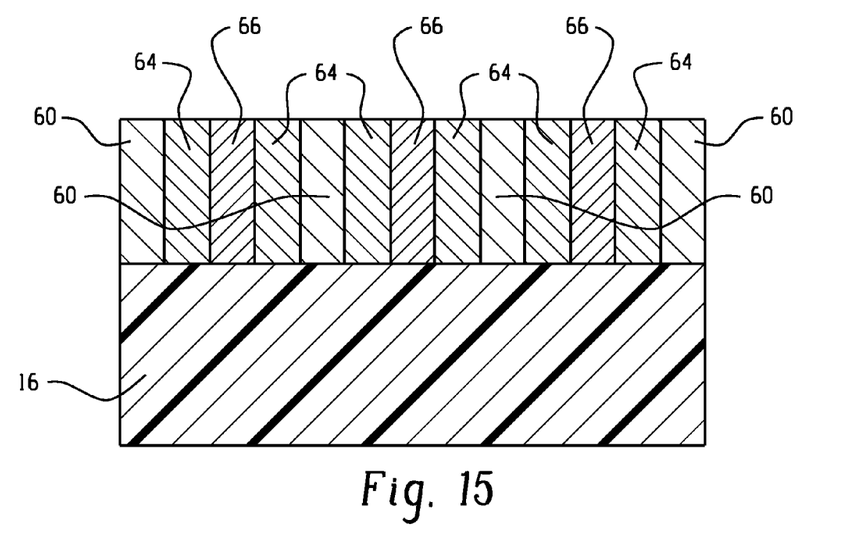

With reference to FIG. 15 in which like reference numerals refer to like features in FIG. 14 and at a subsequent fabrication stage, the open spaces between adjacent pairs of the sacrificial spacers 64 may be filled by depositing and planarizing a layer of material to form hardmask sections 66. The hardmask sections 66 may be composed of hydrogen-enriched silicon oxycarbide (SiCO:H) deposited by, for example, ALD. The material constituting the hardmask sections 66 may be selected to be selectively removed relative to the constituent materials of the hardmask sections 60 and sacrificial spacers 64.

Figure 16:
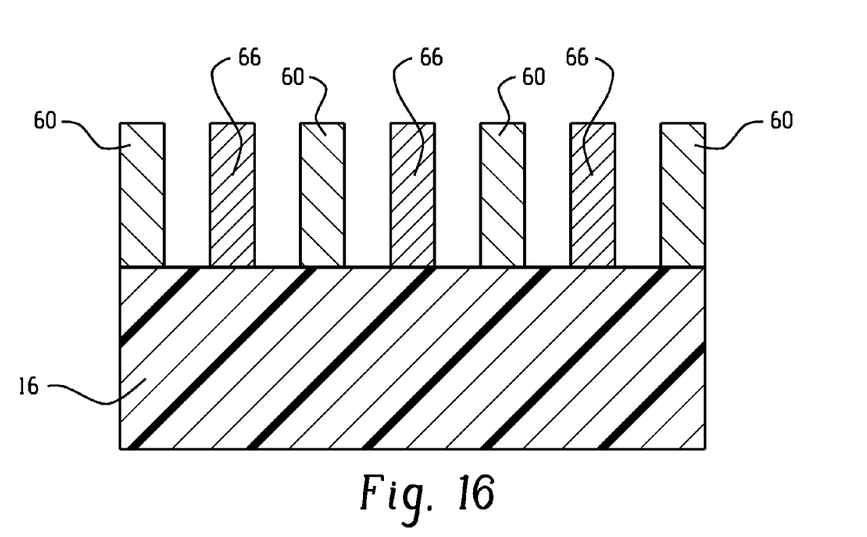

With reference to FIG. 16 in which like reference numerals refer to like features in FIG. 15 and at a subsequent fabrication stage, the sacrificial spacers 64 are removed selective to the hardmask sections 66 and selective to the hardmask sections 60. The thickness of the sacrificial spacers 64 and the conformal layer used to form the spacers establishes, at least in part, the pitch of the hardmask sections 60, 66. The thickness of the sacrificial spacers 64 also determines, at least in part, the width of the hardmask sections 66.

Processing may continue as shown in FIGS. 4-6 to form the fins 38 using the hardmask sections 60 and hardmask sections 66 to pattern the substrate 16.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a first plurality of hardmask sections each comprised of a first material;
    forming sacrificial spacers on vertical sidewalls of the first plurality of hardmask sections;
    filling gaps between the sacrificial spacers with a second material selected to etch selectively to the first material in order to define a second plurality of hardmask sections each comprised of the second material;
    applying a first etch mask with a first opening that exposes at least one of the first plurality of hardmask sections and at least one of the second plurality of hardmask sections;
    after applying the first etch mask, removing at least one of the first plurality of hardmask sections selective to the second plurality of hardmask sections;
    after removing the least one of the first plurality of hardmask sections, removing the first etch mask;
    applying a second etch mask with a second opening that exposes at least one of the first plurality of hardmask sections and at least one of the second plurality of hardmask sections; and
    after applying the second etch mask, removing at least one of the second plurality of hardmask sections selective to the first plurality of hardmask sections.

2. The method of claim 1 wherein the first material is amorphous carbon, the second material is silicon dioxide, and the sacrificial spacers are comprised of silicon nitride.

3. The method of claim 1 wherein the first material is silicon nitride, the second material is hydrogen-enriched silicon oxycarbide, and the sacrificial spacers are comprised of silicon dioxide.

4. The method of claim 1 wherein the first plurality of hardmask sections and the second plurality of hardmask sections are interleaved and have an alternating arrangement.

5. The method of claim 1 wherein the first plurality of hardmask sections and the second plurality of hardmask sections are arranged in a pattern on a hardmask layer, and further comprising:
    transferring the pattern to the hardmask layer; and
    transferring the pattern from the hardmask layer to a substrate to form a plurality of fins.

6. The method of claim 1 wherein forming the first plurality of hardmask sections each comprised of the first material comprises:
    forming a hardmask layer comprised of the first material on a substrate; and
    patterning the hardmask layer to form the first plurality of hardmask sections.

7. The method of claim 1 wherein filling the gaps between the sacrificial spacers with the second material selected to etch selectively to the first material to define the second plurality of hardmask sections each comprised of the second material comprises:
    depositing a layer of the second material to fill the gaps; and
    planarizing the layer to be coplanar with the sacrificial spacers and the first plurality of hardmask sections.

8. The method of claim 1 wherein the first plurality of hardmask sections and the second plurality of hardmask sections are located on a substrate, and further comprising:
    etching the substrate with the first plurality of hardmask sections and the second plurality of hardmask sections masking the substrate to form a plurality of fins.

9. The method of claim 1 wherein the sacrificial spacers are comprised of a third material selected to etch selectively to the first material and the second material, and further comprising:
    after the at least one of the second plurality of hardmask sections is removed, removing the sacrificial spacers selective to the first plurality of hardmask sections and the second plurality of hardmask sections.

10. The method of claim 9 wherein the at least one of the first plurality of hardmask sections is removed selective to the second plurality of hardmask sections before removing the sacrificial spacers.

11. The method of claim 1 wherein the sacrificial spacers are comprised of a third material selected to etch selectively to the first material and the second material, and further comprising:
    removing the sacrificial spacers selective to the first plurality of hardmask sections and the second plurality of hardmask sections.

12. The method of claim 11 wherein the at least one of the second plurality of hardmask sections is removed selective to the first plurality of hardmask sections after removing the sacrificial spacers.

13. The method of claim 12 wherein the at least one of the first plurality of hardmask sections is removed selective to the second plurality of hardmask sections after removing the sacrificial spacers.

14. A method comprising:
    forming a hardmask layer on a substrate;
    forming a first plurality of hardmask sections on the hardmask layer;
    forming sacrificial spacers on vertical sidewalls of the first plurality of hardmask sections;
    etching the hardmask layer selective to the sacrificial spacers and the first plurality of hardmask sections to form trenches in the hardmask layer; and
    filling the trenches with a second plurality of hardmask sections,
    wherein the first plurality of hardmask sections and the second plurality of hardmask sections are comprised of hydrogen-enriched silicon oxycarbide, the sacrificial spacers are comprised of silicon dioxide, and the hardmask layer is comprised of silicon nitride.

15. The method of claim 14 wherein the first plurality of hardmask sections and the second plurality of hardmask sections are interleaved and have an alternating arrangement.

16. The method of claim 14 further comprising:
etching the substrate with the first plurality of hardmask sections and the second plurality of hardmask sections masking the substrate to form a plurality of fins.

17. The method of claim 14 wherein the sacrificial spacers on adjacent pairs of the first plurality of hardmask sections are separated by a gap, and each gap is aligned with one of the trenches formed in the hardmask layer.

18. A method comprising:
forming a first plurality of hardmask sections each comprised of a first material;
forming sacrificial spacers on vertical sidewalls of the first plurality of hardmask sections;
filling gaps between the sacrificial spacers with a second material selected to etch selectively to the first material in order to define a second plurality of hardmask sections each comprised of the second material;
after filling the gaps, removing the sacrificial spacers;
after removing the sacrificial spacers, applying an etch mask with an opening that exposes at least one of the first plurality of hardmask sections and at least one of the second plurality of hardmask sections; and
after applying the etch mask, removing at least one of the first plurality of hardmask sections selective to the second plurality of hardmask sections,
wherein the first plurality of hardmask sections and the second plurality of hardmask sections are comprised of hydrogen-enriched silicon oxycarbide, the sacrificial spacers are comprised of silicon dioxide, and the hardmask layer is comprised of silicon nitride.

19. The method of claim 18 wherein the first plurality of hardmask sections and the second plurality of hardmask sections are interleaved and have an alternating arrangement.

* * * * *

UNITED STATES PATENT AND TRADEMARK OFFICE
CERTIFICATE OF CORRECTION

PATENT NO.        : 9,911,619 B1
APPLICATION NO.   : 15/291446
DATED             : March 6, 2018
INVENTOR(S)       : Xie et al.

It is certified that error appears in the above-identified patent and that said Letters Patent is hereby corrected as shown below:

In the Claims

At Column 9, Claim number 1, Line number 44, before "least" insert --at--

Signed and Sealed this
Eighteenth Day of September, 2018

Andrei Iancu
*Director of the United States Patent and Trademark Office*